(12) United States Patent (10) Patent No.: US 9,420,701 B2
Yang et al. (45) Date of Patent: Aug. 16, 2016

(54) FLEXIBLE DIRECT OR USB PLUG-IN PLATFORM FOR FOLDABLE OR FLEXIBLE ELECTRONICS

(71) Applicant: THE TRUSTEES OF COLUMBIA UNIVERSITY IN THE CITY OF NEW YORK, New York, NY (US)

(72) Inventors: Shyuan Yang, New York, NY (US); Ioannis Kymissis, New York, NY (US)

(73) Assignee: THE TRUSTEES OF COLUMBIA UNIVERSITY IN THE CITY OF NEW YORK, New York, NY (US)

( * ) Notice: Subject to any disclaimer, the term of this patent is extended or adjusted under 35 U.S.C. 154(b) by 142 days.

(21) Appl. No.: 14/093,726

(22) Filed: Dec. 2, 2013

(65) Prior Publication Data

US 2014/0154899 A1 Jun. 5, 2014

Related U.S. Application Data

(60) Provisional application No. 61/731,914, filed on Nov. 30, 2012, provisional application No. 61/774,495, filed on Mar. 7, 2013.

(51) Int. Cl.
*H01R 12/00* (2006.01)
*H05K 3/32* (2006.01)
(Continued)

(52) U.S. Cl.
CPC .................. *H05K 3/32* (2013.01); *H01R 12/79* (2013.01); *H05K 1/118* (2013.01); *H01R 12/721* (2013.01); *H05K 1/028* (2013.01); *H05K 3/326* (2013.01); *H05K 2201/051* (2013.01); *H05K 2201/052* (2013.01); *H05K 2201/053* (2013.01); *H05K 2201/055* (2013.01); *H05K 2201/09754* (2013.01); *Y10T 29/4913* (2015.01)

(58) Field of Classification Search
CPC ............................ H01R 9/0742; H01R 9/0735
USPC ...................... 439/496, 329, 67, 493
See application file for complete search history.

(56) References Cited

U.S. PATENT DOCUMENTS 5,044,980 A * 9/1991 Krumme ................ H01R 12/62
439/433
6,027,347 A 2/2000 Reichle
(Continued)

OTHER PUBLICATIONS

"Airborn Flexible Circuits, Inc—Capabilities", [Online]. Retrieved from Internet: <http://www.strataflex.com/capabilities.php>, (Accessed Feb. 14, 2013), 2 pgs.
(Continued)

*Primary Examiner* — Phuongchi T Nguyen
(74) *Attorney, Agent, or Firm* — Wilmer Cutler Pickering Hale and Dorr LLP

(57) ABSTRACT

An apparatus comprises a flexible circuit substrate that includes a body portion and at least one connector portion formed monolithically with the body portion. The connector portion is shaped by at least one of one or more bends of the flexible circuit substrate or one or more folds of the flexible circuit substrate, and the connector portion is configured to be received in a receptacle of a connector device. The apparatus also includes at least one electrode formed on the connector portion and configured to make electrical contact with an electrical conductor of the receptacle of the connector device, at least one electronic component on the flexible circuit substrate, and interconnect to provide electrical continuity from the electrode to the electronic component.

17 Claims, 6 Drawing Sheets

(51) Int. Cl.
*H01R 12/79* (2011.01)
*H05K 1/11* (2006.01)
*H01R 12/72* (2011.01)
*H05K 1/02* (2006.01)

(56) References Cited

U.S. PATENT DOCUMENTS

| | | | |
|---|---|---|---|
| 6,077,124 | A | 6/2000 | Etters et al. |
| 7,377,448 | B2 | 5/2008 | Dan et al. |
| 7,458,825 | B2 | 12/2008 | Atsmon et al. |
| 8,203,847 | B2 | 6/2012 | Koh |
| 8,564,279 | B2 | 10/2013 | Johnson et al. |
| 2010/0061070 | A1* | 3/2010 | Koh ................ H05K 1/189 361/764 |
| 2012/0106095 | A1 | 5/2012 | Daniel |

OTHER PUBLICATIONS

Gergel-Hackett, Nadine, et al., "A Flexible Solution-Processed Memristor", IEEE Electron Device Letters, 30(7), (Jul. 2009), 706-708.

Sazonov, Andrei, et al., "Low-Temperature Materials and Thin Film Transistors for Flexible Electronics", Proceedings of the IEEE, 93(8), (Aug. 2005), 1420-1428.

Sekitani, Tsuyoshi, et al., "Organic Nonvolatile Memory Transistors for Flexible Sensor Arrays", Science, 326(5959), (Dec. 11, 2009), 1516-1519.

Cheng, I-Chun, et al., "Chapter 1: Overview of Flexible Electronics Technology", Flexible Electronics. Electronic Materials: Science & Technology, vol. 11, (2009), 1-28.

* cited by examiner

FIG. 8A
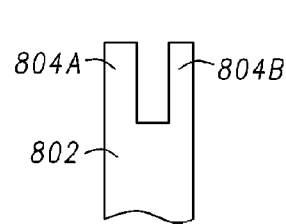
FIG. 8B
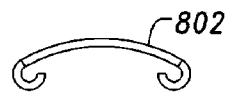
FIG. 8C
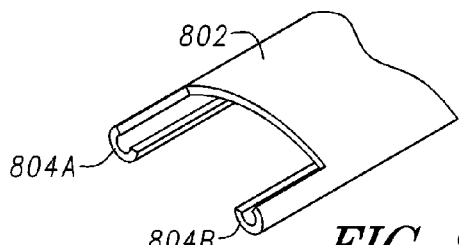
FIG. 8D
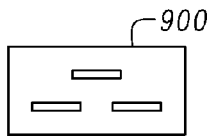
FIG. 9A
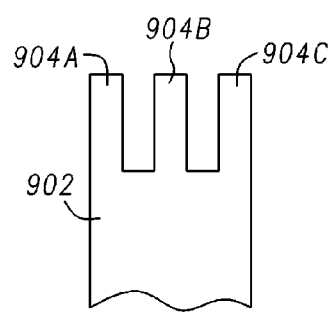
FIG. 9B
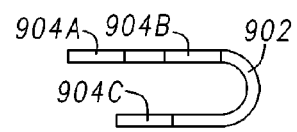
FIG. 9C
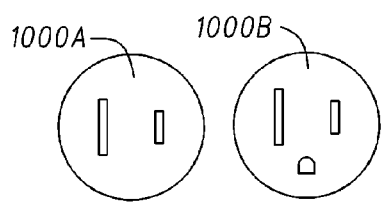
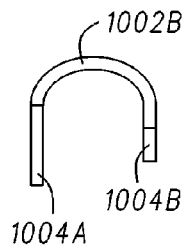
FIG. 10A
FIG. 10B

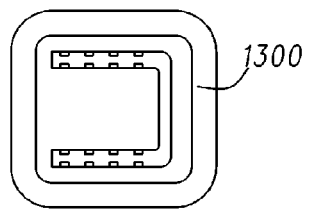
*FIG. 13A*
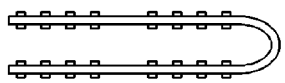
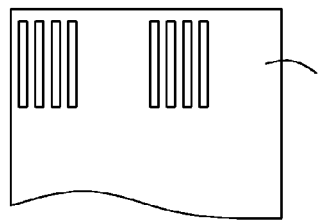
*FIG. 13C*
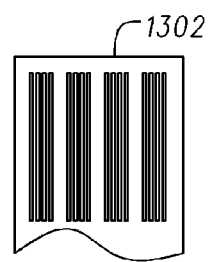
*FIG. 13B*
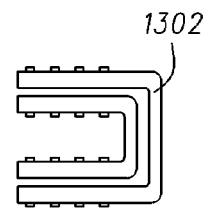
*FIG. 13D*
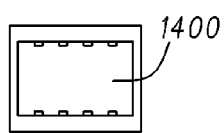
*FIG. 14A*
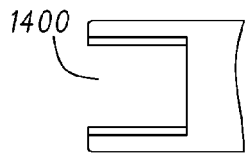
*FIG. 14B*
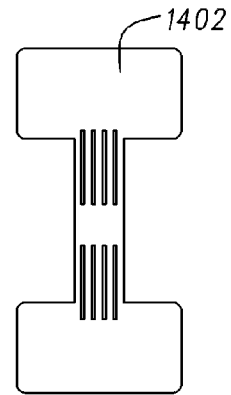
*FIG. 14C*
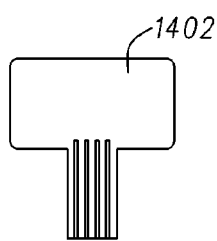
*FIG. 14D*
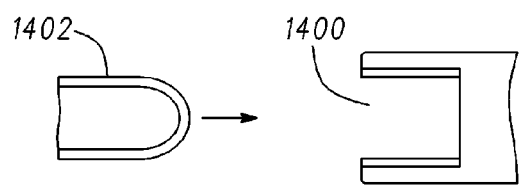
*FIG. 14E*  *FIG. 14F*

US 9,420,701 B2

FLEXIBLE DIRECT OR USB PLUG-IN PLATFORM FOR FOLDABLE OR FLEXIBLE ELECTRONICS

CLAIM OF PRIORITY

This application claims the benefit of U.S. Provisional Application Ser. No. 61/731,914, filed on Nov. 30, 2012, and claims the benefit of U.S. Provisional Application Ser. No. 61/774,495, filed on Mar. 7, 2013, the benefit of priority of each of which is claimed hereby, and each of which are incorporated by reference herein in its entirety.

BACKGROUND

Flexible electronic circuits provide for assembly of electronic devices on a flexible circuit substrate. This allows for printed circuit board (PCB) assemblies that are flexible to fit into tighter spaces of electronic products to reduce the size of the finished product. This is desirable in any technology area where it is desired to reduce the size of the finished product such as personal electronic devices (e.g., cell phones) and medical devices. The present inventors have recognized a need for improvement to flexible electronic circuits to extend their application.

Overview

The present system, devices, and methods described herein relate to providing power to flexible electronic circuits by direct connection of flexible or foldable electronic circuits to a receptacle providing the circuit power. An apparatus comprises a flexible circuit substrate that includes a body portion and at least one connector portion formed monolithically with the body portion. The connector portion is shaped by at least one of one or more bends of the flexible circuit substrate or one or more folds of the flexible circuit substrate, and the connector portion is configured to be received in a receptacle of a connector device. The apparatus also includes at least one electrode formed on the connector portion and configured to make electrical contact with an electrical conductor of the receptacle of the connector device, at least one electronic component on the flexible circuit substrate, and includes interconnect to provide electrical continuity from the electrode to the electronic component.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 8A, 8B, 8C, and 8D show portions of an example of a flexible circuit platform that can be received directly into a connector device having multiple receptacles.

FIGS. 9A-C, 10A-C, 11A-C, and 12A-C show portions of further examples of a flexible circuit platform that can be received directly into a connector device having multiple receptacles.

FIGS. 13A, 13B, 13C, and 13D show portions of an example of a flexible circuit platform that can be received directly into a connector device having a receptacle that includes a center post and an inside periphery.

FIGS. 14A-F show portions of an example of a flexible circuit platform that can be received directly into a connector device including rectangular volume receptacle.

DETAILED DESCRIPTION

Flexible electronic circuits or flex circuits are emerging as an industry with wide-reaching applications. Systems, devices, and methods are described herein that extend the application of flexible electronic circuits by providing a direct interface between the flexible electronics circuit and interfaces such as, among other things, a USB receptacle, an alternating current (AC) power receptacle, an audio or video jack plug receptacle, and a display port receptacle. This allows for an expansion of the types of flexible electronic devices that can be made available, reduces the cost of electronic circuits, and allows at least portions of such systems and devices to be biodegradable.

Figure 1:
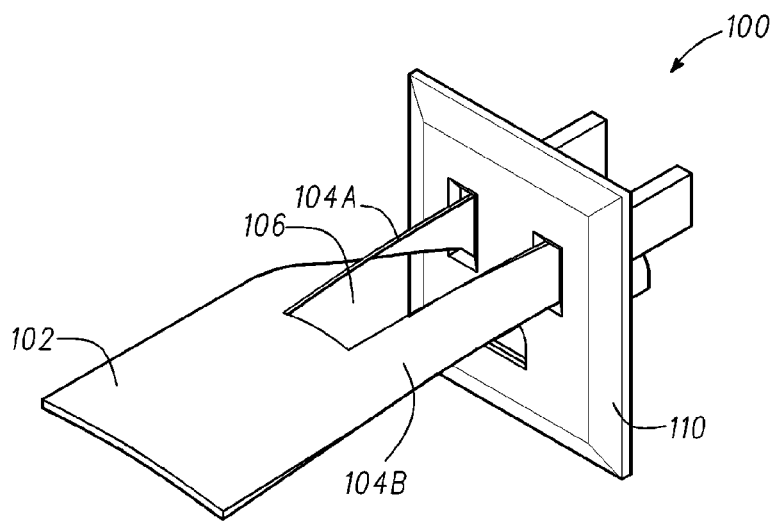
FIG. 1 shows an example of a flexible circuit platform that can be plugged directly into one or more receptacles, such as into the receptacles of an AC or other power outlet.

FIG. 1 shows an example of a flexible circuit platform having a flexible circuit substrate that includes a body portion and a connector portion. The flexible circuit platform 100 in the example can be configured to plug directly into one or more receptacles, such as into the receptacles of a connector device such as an AC power outlet or other power outlet. The example of FIG. 1 shows a flexible circuit substrate configured to plug into the receptacles of a standard 110 Volt wall outlet 110. The flexible circuit substrate can include a main portion or body portion 102 and at least one connector portion. In the example of FIG. 1, two connector portions are formed into two electrode appendages 104A-B. At least one electrode is formed on a connector portion to allow the electrode appendage to make electrical contact with an electrical conductor of the receptacle of the connector device. In certain examples, the connector portions are configured as appendages to be received in the receptacle of an AC connector device that meets a National Electrical Manufactures Association (NEMA) standard.

The electrode appendages 104 can protrude out from the body portion 102. For example, the electrode appendages 104A-B can be formed as part of a flexible planar main body, and a cutout region 106 therebetween can be provided to separate the appendages. The cutout region 106 can leave enough space between the electrode appendages 104A-B such that the electrode appendages 104A-B can be flexed into an orientation that is not coplanar with the body portion 102. In variations, the electrode appendages 104A-B can be flexed approximately orthogonal to their original orientation that was coplanar to the body portion 102. Such bending of the electrode appendages 104A-B can be accompanied by some flexing of the body portion 102.

The material used for the electrode appendages 104A-B and the body portion 102 can be flexible enough to accommodate this flexing of the electrode appendages 104A-B into the orthogonal orientation from the original orientation, such as to accommodate directly plugging in the electrode appendages 104A-B into the vertically-oriented and horizontally spaced-apart receptacles of the standard power outlet 110 of the example of FIG. 1. The flexible circuit platform 100 can use the present principles to be additionally or alternatively configured or adapted for direct plug-in to one or more other power outlets or one or more other connectors. One or both of the electrode appendages 104A-B can also be sized, shaped, positioned, or otherwise configured to be long enough and flexible enough to be folded back over itself (e.g., back toward the body portion 102), and resilient enough such that the folded-over sections can be pushed toward one or both internal edges of the corresponding receptacle of the power outlet 110. The folding or bending can help provide a restoring force or a mechanical bias to promote or ensure mechanical and electrical contact between an electrical conductor in or on the electrode appendages 104A-B and an electrical conductor in the receptacle of the power outlet 110, respectively.

In some examples, the body portion 102 and the electrode appendages 104A-B can both be formed from the same unitary or monolithic flexible substrate. The flexible substrate can include an insulating material (e.g., among other things, polyethylene naphthalate (PEN), polyethylene terephthalate (PET), paper, etc.). A metal or other conductive material can be formed or patterned on the insulating material, such as using, among other things, one or more of thermal evaporation, electroplating, electrochemistry, lithography, and laser patterning. The metal or other conductive material can be used to form the electrodes of the appendages. This allows the appendages 104A-B to serve as blade plugs for a corresponding receptacle of an AC power connector or other type connector.

In certain examples, the body portion 102 can include, or can be monolithically integrated with, a flexible electronic circuit that can include or support one or more organic or inorganic electronic, optoelectronic, optical, mechanical, or other components. In some variations, one or more integrated circuit (IC) components can be integrated with the body portion 102 of the flexible circuit platform 100, such as by using a bonding technique, a flip-chip bonding technique, or other mounting technique. In some variations an electronic circuit component can be formed in layers of one or both of the body portion and the connector portion of the flexible circuit substrate. A metal or other conductive material can be formed to provide conductive interconnect leading from the electrodes of the appendages to the body portion 102. The device in the example of FIG. 1 can provide a flexible direct plug-in platform that can be used as an interface between the power outlet 110 and electronics or one or more other components that can be included in or mounted or coupled to platform 100, such as to the main body 102 or to one or more of the electrode appendages 104A-B of the flexible platform 100. The device can provide an electronic assembly that includes cost-efficient, disposable, and/or biodegradable electronic or other devices.

Figure 2:
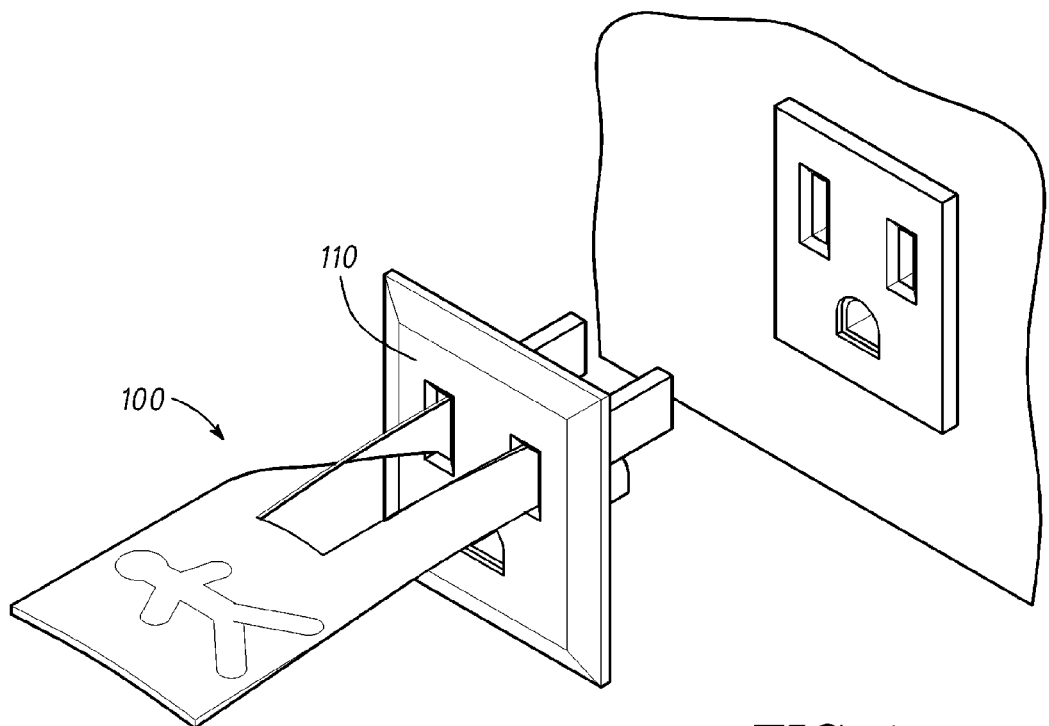
FIG. 2 shows an example in which AC power has been applied to the flexible circuit platform of FIG. 1.

FIG. 2 shows an example in which AC power has been applied to a flexible circuit platform 100, such as a flexible circuit platform described in regard to FIG. 1. The flexible circuit platform 100 includes one or more light-emitting diodes (LEDs) or other light-emitting components to create a display that is powered using the power outlet 110. In variations, the flexible platform can include organic or inorganic passive electronic components, active electronic components (e.g., transistors or memory cells), or mechanical components. Among other things, the example of FIG. 2 demonstrates use of the flexible circuit platform 100 that integrates both electrodes and electronic components, and can eliminate a need for using any intermediate electronic adapter devices between a flexible electronic circuit and an AC power outlet or other connector.

Figure 3:
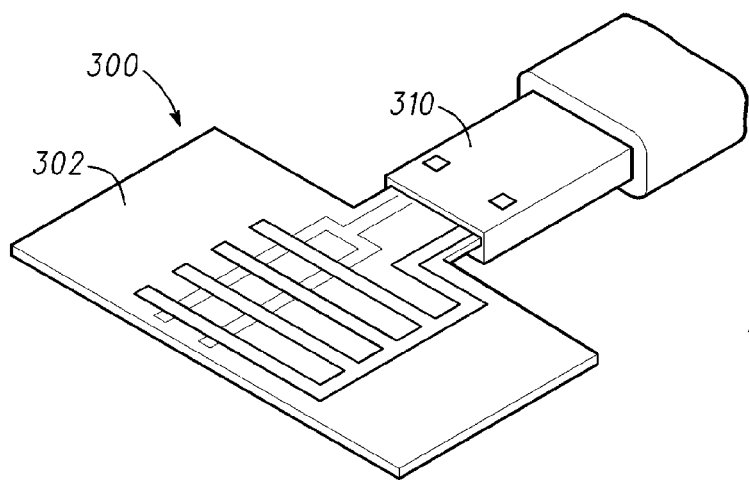
FIG. 3 shows an example of a flexible circuit platform that can be plugged directly into one or more receptacles, such as into the receptacles of a Universal Serial Bus (USB).

FIG. 3 shows an example of a flexible circuit platform 300 that can be configured to plug directly into one or more receptacles, such as into the receptacle of a USB connector 310, such as shown in the example of FIG. 3. The platform has a flexible circuit substrate that can include a body portion 302 and one or two or more connector portions formed into electrode appendages 304 or pins. The electrode appendages 304 can protrude out from the body portion 302 to be received by the USB receptacle. For example, the electrode appendages 304 can be formed as part of a flexible planar body portion 302, and can be sized and shaped to fit within the receptacle of a USB connector 310. The electrode appendages 304 can include one or more patterned conductors that are adapted to align with, contact, and conduct one or more signals using corresponding conductors within the receptacle of the USB connector 310. The electrode appendages 304 can have different lengths to match pin lengths of a standard USB interface.

The flexible circuit platform 300 can use the present principles to be additionally or alternatively configured or adapted for direct plug-in to one or more other connectors or power outlets. For example, the flexible circuit platform 300 can include one or more appendages 104A-B configured for direct plug-in to corresponding one or more receptacles of a standard AC power outlet 110 in addition to including one or more appendages 304 configured for direct plug-in to corresponding one or more receptacles of one or more USB connectors 310.

The electrode appendage 304 can also be sized, shaped, or otherwise configured to be long enough and flexible enough to be folded back over itself, e.g., back toward the body portion 302, and resilient enough such that the folded-over portion can be pushed toward one or both internal edges of the corresponding receptacle of the USB connector 310. This can help provide mechanical biasing to promote or ensure mechanical and electrical contact between one or more electrical power or other electrical signal conductors in or on the electrode appendage 304 and a corresponding one or more electrical conductors in the receptacle of the USB connector 310, respectively. A metal or other conductive material can be formed on the appendages to form pins for insertion into the USB interface to provide conductive interconnect leading from the electrodes of the appendages to the body portion 302.

In some examples, the body portion 302 and the electrode appendages 304A-B can both be formed from the same unitary flexible substrate. A metal or other conductive material can be formed or patterned on the insulating material, such as using, among other things, one or more of thermal evaporation, electroplating, or laser patterning. The body portion 302 can include or be monolithically integrated with a flexible electronic circuit that can include or support one or more organic or inorganic electronic, optoelectronic, optical, mechanical, or other components. For example, one or more integrated circuit die components can be integrated with the body portion 302 of the platform 300, such as using a flip-chip bonding or other mounting technique.

The flexible circuit platform 300 can be used as a direct interface between the USB connector 310 and electronics or one or more other components that can be included in or mounted or coupled to flexible circuit platform 300, such as to the body portion 302 or to the electrode appendage 304 of the flexible circuit platform 300. An example of an application can include cost-efficient disposable or biodegradable electronic or other devices.

Figure 4:
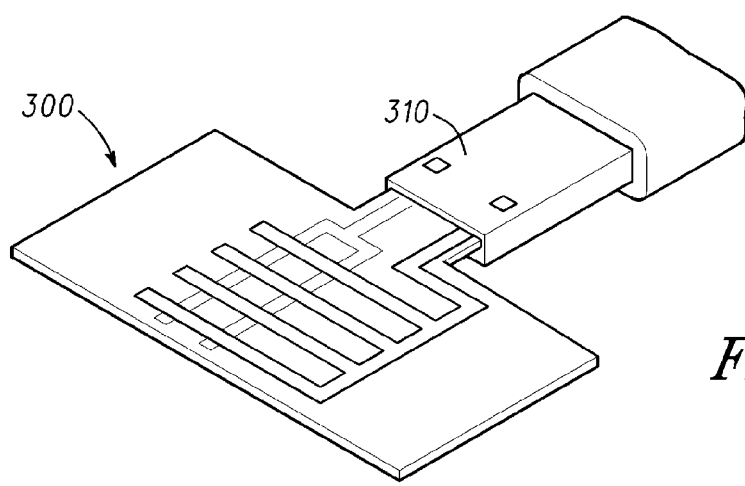
FIGS. 4-5 show an example before (FIG. 4) and after (FIG. 5) power has been applied via the USB connector to the flexible circuit platform of FIG. 3, which can include one or more light-emitting diodes or other light-emitting components.
Figure 5:
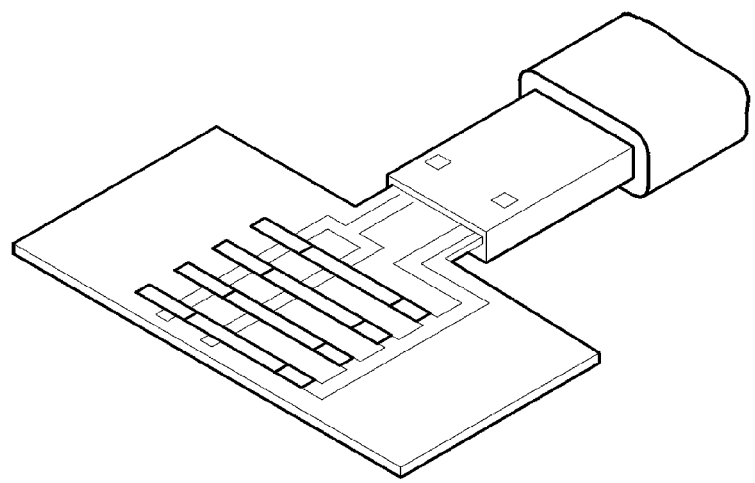

FIGS. 4-5 show an example before (FIG. 4) and after (FIG. 5) power has been applied via the USB connector 310 to the flexible circuit platform 300, which can include one or more light-emitting diodes or other light-emitting components, such as shown in use in the example of FIGS. 4-5. Among other things, the example of FIGS. 4-5 demonstrates use of the flexible circuit platform 300 that can eliminate a need for using intermediate electronic adapter devices between a flexible circuit and an AC power outlet or other connector.

Figure 6A:
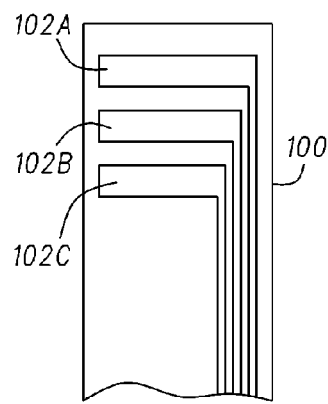
FIGS. 6A, 6B, and 6C show portions of an example of a flexible circuit platform that can be received directly into a receptacle of a connector device, such as a jack plug type receptacle.
Figure 6B:
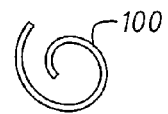
Figure 6C:
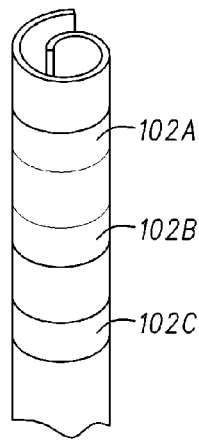

FIGS. 6A, 6B, and 6C show portions of an example of a flexible platform 100 that can be configured to plug directly into one or more types of receptacle, such as into an audio or video jack plug connector type receptacle. The flexible circuit platform 100 includes a flexible circuit substrate having a body portion and a connector portion. The connector portion is shown in the example and FIG. 6A shows a lateral view of the connector portion while it is still substantially planar prior to forming. The connector portion can include at least one bend to form (e.g., roll) the platform into a substantial cylindrical shape to form a plug for the receptacle of a connector device. The substantially cylindrical shape may have a completely cylindrical shape, or may have a cross section that is not completely circular (as shown in the example of an end view of a rolled up connector portion in FIG. 6B), or may have a seam lengthwise along the cylindrical shape, or may have a slight opening lengthwise along the cylindrical shape circular (as shown in the example of a lateral view of a rolled up connector portion in FIG. 6C). In certain examples, the diameter of the cross section of the formed plug connector is about 3.5 millimeters (mm).

The connector portion can include one, two, three, or more electrically conductive contact traces, such as contacts 102A, 102B, and 102C. The conductive traces can include transverse portions that can be spaced apart so as to make contact with corresponding individual contacts respectively located at different depths within the receptacle when the connector portion of the flexible circuit substrate is rolled up, such as shown in FIGS. 6B and 6C. The transverse portions can be located at or near a distal end of the flexible circuit substrate and can be electrically connected to respective electrically conductive contact traces extending therefrom, such as in a proximal direction (e.g., such as shown in FIG. 6A). The connector portion can be formed so that the transverse portions of the electrically conductive traces are exposed as ring type electrodes for contact with conductors of the plug receptacle. The number and location of the arranged ring electrodes can be used for, among other things, a headphone connection, a microphone connection, and a video connection.

Figure 7A:
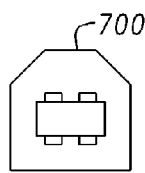
FIGS. 7A, 7B, and 7C show portions of an example of a flexible circuit platform that can be received directly into a receptacle having a center-post, such as for a receptacle of a universal serial bus standard B connector device.
Figure 7B:
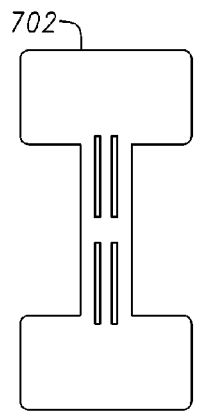
Figure 7C:
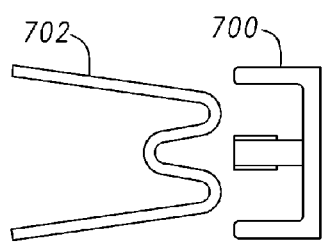

FIG. 7A shows portions of an example of a center-post receptacle, such as for a receptacle of a universal serial bus standard B (USB-B) connector device 700. FIGS. 7B and 7C show an example of a flexible circuit substrate that can be configured to plug directly into the USB-B or other center-post receptacle 700. The flexible circuit substrate can be sized, shaped, or otherwise configured to include a connector portion and a body portion 702 at one or both ends of the flexible circuit substrate. The flexible circuit substrate can optionally include a "dog bone" or other shape, as desired, such as shown in the unfolded side view of FIG. 7B. The example in FIG. 7B includes a body portion at both ends of the flexible circuit substrate and one or both of the body portions can accommodate inclusion or placement of one or more electronic components in or onto the flexible circuit substrate.

The connector portion includes a plurality of folds to form an appendage that fits within the connector device and extends outward from the body portion of the flexible circuit substrate for arrangement over the center post receptacle of the connector device. In the example shown in FIG. 7C, the connector portion has been folded into a "W" shape. The connector portion includes electrically conductive traces. The electrically conductive traces have exposed regions that can be sized, shaped, positioned, or otherwise configured to form electrodes for electrical contact with electrodes arranged on the center post receptacle of the connector device. The connector portion is flexible enough to accommodate insertion of the center-post of the receptacle into a folded region (e.g., the center of the "W"), and is stiff enough to provide a restorative force to bias the electrodes of the connector portion of the flexible circuit substrate against the electrodes of the receptacle for mechanical and electrical contact. The exposed portions of the connector portion can be configured to contact electrodes located on multiples sides of the center post receptacle, such as on the top and bottom of center post of the receptacle 700 as shown in the example of FIGS. 7A and 7C.

FIG. 8A illustrates an example of a connector device that can include multiple receptacles, such as multiple cylindrical receptacles, which can be co-linearly arranged. In some examples, the connector device meets an International Electrotechnical Commission (IEC) standard such as in an IEC C1 or C2 connector 800 as shown in FIG. 8A. FIG. 8B shows a planar (e.g., unrolled) flexible circuit substrate having a body portion 802 and connector portions 804A-B that can be formed into electrode appendages. Each of the connector portions 804A-B can include a lateral bend about a longitudinal axis of the connector portion to roll a connector portion or to form a substantially cylindrical shape, such as shown in FIGS. 8C and 8D. The cylindrical shape is configured to be received over a receptacle of a plurality of receptacles of the connector device (e.g., by sliding over the receptacles).

Electrodes of metal or another conductive material may be formed on the appendages before or after shaping to form electrodes. The body portion 820 may also include a lateral bend to form a curved body portion as shown in the examples of FIGS. 8C and 8D. FIGS. 8A-8C show an example of a connector device having two receptacles. Other examples include a flexible circuit substrate shaped to include three electrode appendages to be received by a connector device with three cylindrical receptacles. The receptacles and electrode appendages may be offset, such as by the two outside receptacles being co-linear and a center receptacle offset from the plane of the two outside receptacles.

FIG. 9A illustrates an example of a connector device that can include multiple receptacles, such as multiple rectangular volume receptacles that can have an arrangement of receptacles that is a combination of co-linear and offset receptacles, such as an IEC C19 or C20 connector 900 as shown in FIG. 9A. FIG. 9B shows a planar (e.g., unrolled) flexible circuit substrate having a body portion 902 and connector portions 904A-C that extend away from the flexible circuit substrate. The connector portions can be formed into electrode appendages that are flat or unrolled. The flexible circuit substrate includes one or more lateral bends about a longitudinal axis of the flexible circuit substrate to position the plurality of connector portions to be received by a plurality of receptacles of the connector device, such as shown in FIG. 9C. In variations, only the body portion 902 includes the lateral bend. The electrode appendages 904A, 904B, 904C that can be sized, shaped, positioned, or otherwise configured to respectively electrically contact corresponding electrical contacts in the receptacles of the connector 900. A metal or other conductive material can be included in the electrode appendages 904A, 904B, and 904C to form plug-in blades for insertion into the receptacles of the connector 900.

FIG. 10A illustrates an example of a connector device that can include multiple receptacles, such as multiple rectangular volume receptacles. The rectangular volume receptacles can be arranged co-linear in a direction orthogonal to an elongation direction of the receptacles. In some examples, the connector device is a plug receptacle that meets an NEMA standard for an AC power receptacle. FIG. 10A illustrates a two-terminal example 1000A that can be a NEMA 1-15 receptacle. FIG. 10B illustrates a three-terminal example 1000B that can be a NEMA 5-15 receptacle. The three-terminal example 1000B can include an offset third terminal that can be somewhat rounded or cylindrical, instead of a rectangular volume.

FIGS. 10A-B show an example of forming a flexible circuit substrate to have appendages that can be received into the receptacles of the two-terminal example 1000A. FIG. 10A shows a planar (e.g., unrolled) flexible circuit substrate having a body portion 1002A and connector portions 1004A-B that extend away from the flexible circuit substrate. The connector portions can be formed into electrode appendages that are flat or unrolled. The flexible circuit substrate includes one or more lateral bends about a longitudinal axis of the flexible circuit substrate to position the plurality of connector portions to be received by a plurality of receptacles of the connector device, such as shown in FIG. 10B. In variations, only the body portion 1002B includes the lateral bend. The connector portions 1004A-B can include electrically conductive contact portions and that can be sized, shaped, positioned, or otherwise configured to respectively electrically contact corresponding electrical contacts in the receptacles of the connector device 1000A.

Figure 10C:
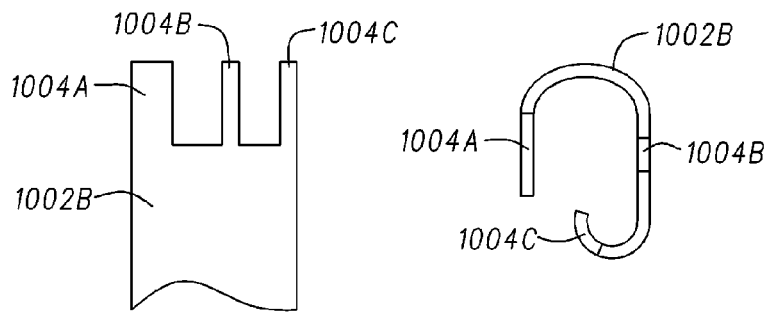

FIG. 10C shows an example of forming a flexible circuit substrate to include appendages to be received into the receptacles of the three-terminal example 1000B. The connector portions can be formed into two electrode appendages 1004A-B that are flat or unrolled and a third electrode appendage 1004C that is bent or rolled to form an electrode appendage that can be rounded or cylindrical for insertion into the third terminal of the connector device 1000B. One or more of the body portion 1002B and the connector portions may include one or more bends to position the electrode appendages to match one or both of the position and shape of the receptacles of the connector device 1000B.

Figure 11A:
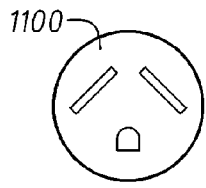

FIG. 11A illustrates an example of a connector device 1100 that can include multiple receptacles, such as multiple rectangular volume receptacles, which can be arranged co-linearly but oriented at an angle thereto, such as shown in FIG. 11A. The connector device 1100 can optionally additionally include a third receptacle, such as offset from the other receptacles to form a third vertex of a triangular arrangement, such as a NEMA TT-30 connector.

Figure 11B:
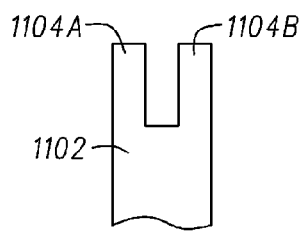
Figure 11C:
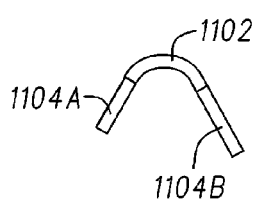

A planar or unrolled flexible circuit substrate shown in FIG. 11B can include a body portion 1102 and electrode appendages 1104A, 1104B, and optionally a third electrode appendage 1104C. FIG. 11C shows that the flexible circuit substrate can include one or more lateral bends about a longitudinal axis of the flexible circuit substrate to position the electrode appendages to correspond to the receptacles of the connector device 1100. In variations, the flexible circuit substrate can include a third appendage that can be rolled or bent to form a third electrode appendage that can be rounded or cylindrical for insertion into the third terminal of the connector device 1100. A metal or other conductive material can be included in the electrode appendages to form plug-in blades for insertion into the receptacles of the connector device 1100.

Figure 12A:
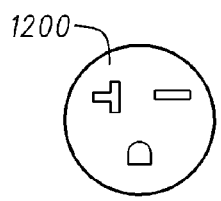

FIG. 12A illustrates an example of a connector device 1200 that can include multiple receptacles. The receptacles can be at least partially rectangular volume receptacles, and can be arranged co-linearly but oriented orthogonally to each other, such as shown in FIG. 12A. The connector device 1200 can optionally additionally include a third receptacle, such as offset from the other receptacles to form a third vertex of a triangular arrangement, such as a NEMA 6-20 connector.

Figure 12B:
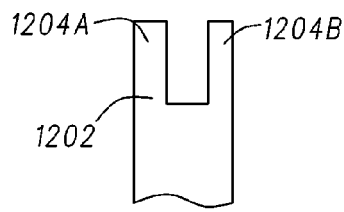
Figure 12C:
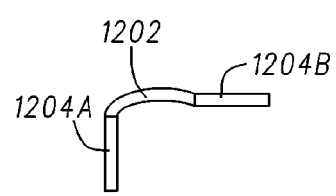

FIG. 12B shows an example of a flexible circuit platform that includes a body portion 1202 and includes connector portions 1204A-B. The flexible circuit substrate can optionally include a third connector portion (not shown). The connector portions can be formed into two electrode appendages and optionally a third electrode appendage. FIG. 12C shows that the flexible circuit substrate can include one or more lateral bends about a longitudinal axis of the flexible circuit substrate to position the electrode appendages 1204A-B to correspond to the receptacles of the connector device 1200. In variations, the flexible circuit substrate includes the third appendage that can be formed to be rounded or substantially cylindrical for insertion into the third terminal of the connector device 1200.

FIG. 13A illustrates portions of an example of a connector device 1300 that includes a receptacle having a center post and an inside periphery, such as a mini display port type connector for example. The connector device 1300 can include individual electrical contacts that can be located on the center post and on the inner wall portions of the connector device 1300. FIG. 13B shows an example of a flexible circuit substrate 1302 that is flat or unfolded. The flexible circuit substrate includes a connector portion and a body portion. The connector portion is shown in FIGS. 13B-D. The body portion may include one or more electronic components bonded to, or formed monolithic to the flexible circuit substrate. The connector portion includes electrically conductive traces. The electrically conductive traces have exposed regions that can be sized, shaped, positioned, or otherwise configured to form electrodes for electrical contact with the individual electrical contacts arranged on the center post receptacle of the connector device.

The flexible circuit substrate can be constructed to be flexible enough, and with electrically conductive electrodes placed so as to align with and respectively electrically contact corresponding electrical contacts of the receptacle 1300, such as when the flexible circuit substrate is folded once, such as shown in FIG. 13C. In variations, the fold includes two ninety-degree bends to match the shape of the connector device 1300. In some examples, the flexible circuit substrate is folded twice as shown in FIG. 13D. The flexible circuit substrate may be thinner in the example of FIG. 13D than the example of FIG. 13C to accommodate the clearance inside the connector device 1300. In some examples, the folded flexible substrate of FIG. 13D provides a restorative force to bias the electrodes of the connector portion to the electrical contacts located on the center post and on the inner wall portions of the connector device 1300.

FIG. 14A illustrates an example of an end view of a connector device including a single rectangular volume receptacle 1400 (e.g., a box-shaped receptacle) with multiple electrode contacts arranged on one or more interior walls of the receptacle 1400, such as on opposing faces thereof. FIG. 14B shows a sectional side view of the connector device.

FIG. 14C shows an example of a side view of an unfolded flexible circuit substrate. The flexible circuit substrate can be sized, shaped, or otherwise configured to include a connector portion and a body portion 1402 at one or both ends of the flexible circuit substrate. The flexible circuit substrate can optionally include a "dog bone" shape or other suitable configuration, as desired. The body portion or portions can include or receive one or more electronic components. The connector portion includes electrically conductive traces. The electrically conductive traces can have exposed regions that can be sized, shaped, positioned, or otherwise configured to form electrodes for electrical contact with electrodes arranged on the one or more interior walls of the inside periphery of receptacle 1400. The conductive traces may be discontinuous from one end of the connector portion to the other. The conductive traces may provide electrical continuity to electronic components of the body portion or portions.

FIG. 14D shows a side view of the flexible circuit substrate when folded. The connector portion of the flexible circuit substrate includes at least one bend or fold to form an appendage that extends outward from the flexible circuit substrate. The appendage is configured by one or more of shape, size, and flexibility to be received by the rectangular volume receptacle of the connector device. FIG. 14E shows a sectional side view of the flexible circuit substrate when folded for insertion into the receptacle 1400, such as shown in the sectional side view of FIG. 14F. The electrodes on the connector portion are positioned to be aligned with corresponding electrical contacts within the receptacle 1400. The connector portion may include a restorative force to bias the electrodes of the connector portion against the electrical contacts within the receptacle 1400.

A method of making a flexible direct plug-in platform for integrated flexible electronic devices can include forming a monolithic flexible circuit substrate having a body portion and at least one connector portion. The flexible substrate can include an insulating material such as, among other things, PEN, PET, and paper. At least one electrode can be formed in the connector portion. The electrode or electrodes provide electrical contact with an electrical conductor or contact of a receptacle of a connector device. The electrodes can include a metal or other conductive material formed or patterned on the insulating material, such as by using, among other things, one or more of thermal evaporation, electroplating, electrochemistry, lithography, and laser patterning. The connector device can include, among other things, an AC power outlet, a USB port, a mini display port, or an audio or video jack plug receptacle.

Electrically conductive interconnect can be formed on the flexible circuit substrate to provide electrical continuity from the electrodes to an electronic component provided on the flexible circuit substrate. The electrically conductive interconnect can be formed of a metal or other conductive material formed or patterned on the insulating material, such as by using, among other things, one or more of thermal evaporation, electroplating, electrochemistry, lithography, and laser patterning.

One or both of the body portion or connector portion can include a component such as one or more organic or inorganic electronic, optoelectronic, optical, mechanical, or other components arranged on the flexible circuit substrate. One or more electronic components can be formed monolithically with the flexible substrate and can be composed of one or more layers of the flexible circuit substrate. The electronic component can be an active component (such as, among other things, a transistor, at least a portion of memory, or a light emitting component), or a passive component (such as, among other things, a capacitor, an inductor, or resistor). The flexible circuit substrate can include bonding pads to receive an electronic component (e.g., an integrated circuit) that is mounted using one or more of a bonding technique, a flip-chip bonding technique, or other mounting technique.

The method can further include shaping the at least one connector portion, such as by at least one of bending the flexible circuit substrate or folding the flexible circuit substrate for example. The shaping configures the connector portion for receiving by a receptacle of the connector device. In some examples, the shaping of the at least one connector portion includes one or more of folding, bending, and rolling a plurality of connector portions to form a plurality of appendages that extend outward from the body portion of the flexible circuit substrate. The appendages can be electrode appendages to be received in the receptacle of the connector device.

In some examples, shaping the at least one connector portion includes laterally bending a plurality of connector portions about a longitudinal axis of the connector portions to form a plurality of substantially cylindrical shaped connector portions. The substantially cylindrical shaped connector portions can be received over a plurality of receptacles of the connector device, such as by sliding the appendages over pin receptacles of the connector device. In some variations, the produced appendages are configured for arrangement over a center post receptacle of the connector device. Electrodes can be formed for making electrical contact with a plurality of electrodes arranged on the center post receptacle of the connector device.

In some examples, shaping the at least one connector portion includes forming the connector portion into a substantially cylindrical shape configured to be received into a receptacle for an audio or video jack plug connector. A plurality of electrically conductive traces can be formed in or on the flexible circuit substrate. The electrically conductive traces can be formed into electrodes arranged along the length of the substantially cylindrical shape to make electrical contact with electrical conductors in the receptacle of the connector device.

The present systems, devices, and methods can eliminate the need for any additional interface between a receptacle that provides power and flexible electronic circuits. The systems, devices, and methods also allow for an expansion of the types of flexible electronic devices that can be made available and can be made available at reduced cost. The reduced cost allows the flexible electronic devices such as flexible plug-n-play devices to be disposable and to be made biodegradable. This can lead to a new increase the amount and type of flexible electronic devices that be made.

Additional Notes

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An apparatus comprising:
 a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;
 at least one electrode formed on the connector portion and configured to make electrical contact with an electrical conductor of the receptacle of the connector device;
 at least one electronic component on the flexible circuit substrate; and
 interconnect to provide electrical continuity from the electrode to the electronic component;
 wherein the electronic component is an active electronic component that is monolithic to the flexible circuit substrate;
 wherein the plurality of connector portions are configured as appendages to be received in the receptacle of an alternating current (AC) outlet connector device.

2. The apparatus of claim 1, wherein the at least one of the bending the flexible circuit substrate, folding the flexible circuit substrate, or rolling the flexible circuit substrate provides a restoring force to bias the at least one electrode to the electrical conductor of the receptacle of the connector device.

3. The apparatus of claim 1, wherein the appendages include a first section and a second section, wherein the first section extends away from the body portion of the flexible substrate and the second section is folded back towards the body portion of the flexible substrate.

4. The apparatus of claim 1, wherein the flexible circuit substrate includes a plurality of connector portions, wherein a connector portion includes a lateral bend about a longitudinal axis of the connector portion to form a substantially cylindrical shape, wherein the cylindrical shape is configured to be received over a receptacle of a plurality of receptacles of the connector device.

5. The apparatus of claim 1, wherein the electronic component is a light emitting electronic component.

6. The apparatus of claim 1, wherein the flexible circuit substrate includes at least one electrode configured to make electrical contact with an electrical conductor of the receptacle of the connector device.

7. The apparatus of claim 6, wherein the appendage is not coplanar with the body portion of the flexible circuit substrate.

8. An apparatus comprising:
 a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;

at least one electrode formed on the connector portion and configured to make electrical contact with an electrical conductor of the receptacle of the connector device;

at least one electronic component on the flexible circuit substrate; and interconnect to provide electrical continuity from the electrode to the electronic component;

wherein the flexible circuit substrate includes a plurality of connector portions extending away from the flexible circuit substrate, and wherein the flexible circuit substrate includes one or more lateral bends about a longitudinal axis of the flexible circuit substrate to position the plurality of connector portions to be received by a plurality of receptacles of the connector device.

9. The apparatus of claim 8, wherein the plurality of connector portions are configured as appendages to be received in the receptacle of a Universal Serial Bus (USB) connector device.

10. An apparatus comprising:

a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;

at least one electrode formed on the connector portion and configured to make electrical contact with an electrical conductor of the receptacle of the connector device;

at least one electronic component on the flexible circuit substrate; and interconnect to provide electrical continuity from the electrode to the electronic component;

wherein the connector portion has at least one bend to form the connector portion into a substantially cylindrical shape configured to be received into a receptacle for an audio or video jack plug connector, wherein the connector portion includes a plurality of electrodes arranged along the length of the substantially cylindrical shape.

11. An apparatus comprising:

a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;

at least one electrode formed on the connector portion and configured to make electrical contact with an electrical conductor of the receptacle of the connector device;

at least one electronic component on the flexible circuit substrate; and interconnect to provide electrical continuity from the electrode to the electronic component;

wherein the connector portion of the flexible circuit substrate includes at least one bend to form an appendage that extends outward from the flexible circuit substrate and is configured to be received by a rectangular volume receptacle of the connector device, wherein the connector portion includes a plurality of electrodes configured for electrical contact with a plurality of electrodes arranged on inside periphery of the rectangular volume receptacle of the connector device.

12. An apparatus comprising:

a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;

at least one electrode formed on the connector portion and configured to make electrical contact with an electrical conductor of the receptacle of the connector device;

at least one electronic component on the flexible circuit substrate; and interconnect to provide electrical continuity from the electrode to the electronic component;

wherein the connector portion of the flexible circuit substrate includes a plurality of lateral folds to configure the connector portion to be received by a receptacle having a center post and an inside periphery, and wherein the connector portion includes a plurality of electrodes arranged to provide electrical contact with a plurality of contacts arranged on the center post and the inside periphery of the receptacle of the connector device.

13. An apparatus comprising:

a flexible circuit substrate including a body portion and at least one connector portion formed monolithically with the body portion, wherein the connector portion is shaped by at least one of bending the flexible circuit substrate, folding the flexible circuit substrate, or rolling the flexible circuit substrate, and wherein the connector portion is configured to be received in a receptacle of a connector device;

at least one electrode formed on the connector portion and configured to make electrical contact with an electrical conductor of the receptacle of the connector device;

at least one electronic component on the flexible circuit substrate; and interconnect to provide electrical continuity from the electrode to the electronic component;

wherein the connector portion includes a plurality of folds to form an appendage that extends outward from the body portion of the flexible circuit substrate for arrangement over a center post receptacle of the connector device, wherein the connector portion includes a plurality of electrodes configured for electrical contact with a plurality of electrodes arranged on the center post receptacle of the connector device.

14. The apparatus of claim 13, wherein the connector portion includes a plurality of electrodes configured for electrical contact with a plurality of electrodes arranged on multiple sides of the center post receptacle of the connector device.

15. An apparatus comprising:

a flexible circuit substrate including a body portion and a plurality of connector portions formed monolithically with the body portion, wherein the connector portions are folded to configure the plurality of connector portions as a plurality of appendages that extend outward from the body portion, wherein the appendages are configured to be received in a receptacle of a connector device;

at least one electrode formed on an appendage and configured to make electrical contact with an electrical contact of the receptacle of the connector device;

at least one active electronic component that is monolithic to the flexible circuit substrate; and interconnect to provide electrical continuity from the electrode to the active electronic component.

16. The apparatus of claim 15, wherein the plurality of appendages are configured to be received in the receptacle of a Universal Serial Bus (USB) connector device.

17. The apparatus of claim 15, wherein the at least one active electronic component includes at least one of an organic transistor or a light emitting electronic device.

* * * * *